(12) United States Patent
Ghannam et al.

(10) Patent No.: US 12,160,976 B2
(45) Date of Patent: Dec. 3, 2024

(54) APPLICATION INTERFACE FOR METAL FOAM COOLING OF VEHICLE ELECTRONICS

(71) Applicant: Ford Global Technologies, LLC, Dearborn, MI (US)

(72) Inventors: Mahmoud Ghannam, Canton, MI (US); Ming Liang, Canton, MI (US); Michael Dupuis, Macomb, MI (US); Deepa Ramaswamy, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 494 days.

(21) Appl. No.: 17/650,502

(22) Filed: Feb. 9, 2022

(65) Prior Publication Data

US 2023/0254994 A1    Aug. 10, 2023

(51) Int. Cl.
*H05K 9/00*  (2006.01)
*H05K 7/20*  (2006.01)

(52) U.S. Cl.
CPC ....... *H05K 7/20236* (2013.01); *H05K 9/0081* (2013.01)

(58) Field of Classification Search
CPC .................................................. H05K 9/0081
See application file for complete search history.

(56) References Cited

U.S. PATENT DOCUMENTS

| | | | |
|---|---|---|---|
| 2006/0137862 A1* | 6/2006 | Huang | H01L 23/427 165/104.33 |
| 2006/0208534 A1 | 9/2006 | Regnell et al. | |
| 2006/0215369 A1 | 9/2006 | Ohashi et al. | |
| 2009/0008066 A1* | 1/2009 | Meng | F28F 13/003 415/177 |
| 2021/0233832 A1* | 7/2021 | Uppal | H01L 23/3737 |
| 2022/0375817 A1* | 11/2022 | Berntson | H01L 23/3735 |
| 2023/0335880 A1* | 10/2023 | Ghannam | H01Q 1/52 |

FOREIGN PATENT DOCUMENTS

DE    102019131159 A1    5/2021

OTHER PUBLICATIONS

Parker Chomerics, Thermal Interface Materials for Electronics Cooling, Thermal Interface Materials for Electronics Cooling, Products & Custom Solutions Catalog, Jul. 2, 2021.

* cited by examiner

*Primary Examiner* — Hung V Ngo
(74) *Attorney, Agent, or Firm* — Frank Lollo; Eversheds Sutherland (US) LLP

(57) ABSTRACT

This disclosure describes systems and methods for metal foam cooling of vehicle electronic. An example apparatus may include an electronic control unit (ECU) comprising an electronic component included within a housing. The example apparatus may also include a metal foam configured to dissipate heat produced by the electronic component and also configured to facilitate electromagnetic interference (EMI) shielding for the electronic component. The example apparatus may also include an interface between the ECU and the metal foam, wherein the interface provides a connection between the ECU and metal foam to facilitate heat dissipation from the electronic component to a location outside of the housing.

16 Claims, 7 Drawing Sheets

APPLICATION INTERFACE FOR METAL FOAM COOLING OF VEHICLE ELECTRONICS

BACKGROUND

In general, vehicle original equipment manufacturers (OEM) may prefer passive cooling solutions that rely on natural airflow for vehicle electronics (such as electronic control units (ECUs)). This is due to associated advantages in weight and maintenance versus more active cooling solutions (for example, using liquid cooling solutions). However, vehicle computing systems are becoming increasingly complex, and thus the heat dissipation requirements are also increasing.

BRIEF DESCRIPTION OF THE DRAWINGS

The detailed description is set forth with reference to the accompanying drawings. The use of the same reference numerals indicates similar or identical components or elements; however, different reference numerals may be used as well to indicate components or elements which may be similar or identical. Various embodiments of the disclosure may utilize elements and/or components other than those illustrated in the drawings, and some elements and/or components may not be present in various embodiments. Depending on the context, singular terminology used to describe an element or a component may encompass a plural number of such elements or components and vice versa.

DETAILED DESCRIPTION

Figure 1:
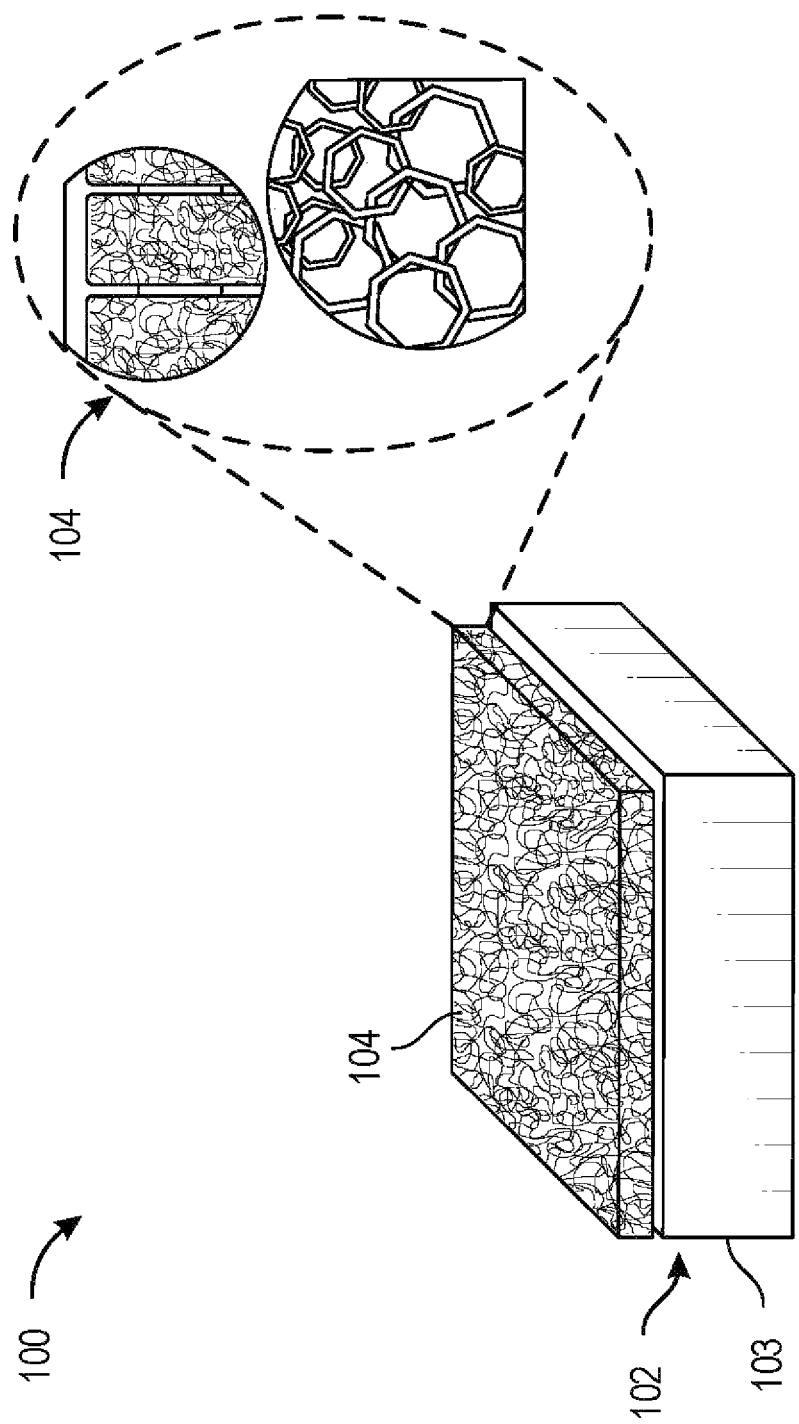
FIG. 1 illustrates an example of an electronic component including a metal foam shield, in accordance with one or more embodiments of the disclosure.

This disclosure relates to, among other things, an application interface for a metal foam cooling system used for vehicle electronic modules (for example, ECUs and/or any other types of vehicle electronics). Different types of these modules may include signals that are characterized by different frequencies. Any electromagnetic (EM) waves generated from these different frequency signals may interfere with the operation of other components in the vehicle. Therefore, OEMs have established electromagnetic compatibility (EMC) and/or electromagnetic interference (EMI) specifications. All active components included within a particular vehicle therefore may need to meet these specifications for production. For example, to mitigate the issues associated with electromagnetic interference (EMI), electronic modules may often include a metal housing that encompasses either an entire electronic component or individual portions of the electronic component, with the metal housing serving as a shield for the EMI. Thus, the term "electronic module" may refer to an overall package including the electronic component or components and the housing encompassing the component. An electronic component may include, for example, various types of circuity and/or processing units, such as integrated circuits (ICs) that are included within the housing of the electronic module and are used to perform any of the processing and/or other functions associated with the operation of the vehicle. It should be noted, however, that the use of the metal foam may also be applicable to any other type of element included within a vehicle that may produce EM waves and/or heat as well.

While this type of metal housing may improve EMI, this type of housing may also be associated with downsides in terms of dissipation of any heat generated by the component. That is, the housing provides an additional layer of material for the heat transfer from the inside of the module to the open-air environment external to the module. This may be problematic because the components may be required to operate within a specific temperature range, so it may be crucial to perform heat dissipation to enable the component to remain in that operating range.

In one or more embodiments, the approach described herein may mitigate this downside of using a metal housing for EMI shielding by replacing or supplementing the typical housing with a metal foam. That is, the metal foam may be used in place of, or in conjunction with the typical housing that may be provided around the electronic component for EMI shielding purposes. In contrast with the metal housing, the metal foam may serve a dual functionality of improved EMI shielding as well as improved heat dissipation (or in the case where the metal foam is added to the housing, the metal foam may add additional heat dissipation and EMI shielding). The approach described herein may also include a number of different types of interfaces that may be used between the metal foam and the electronic module and/or electronic component itself.

In one or more embodiments, the metal foam may comprise an aluminum material (and/or any other type of material or combination of different types of materials) and may be attached to a surface (internal and/or external) of an ECU (for simplicity sake, subsequent examples provided herein may refer to an ECU, however, the same may be applicable to any other type of component). In general, the EM waves are reflected and absorbed by the metal foam based on the frequency of emission. As a result of this, the transmitted EM wave energy level is reduced and the EMI is mitigated in any other components in the vehicle. Additionally, the EMI shielding may be bidirectional. Namely, the metal foam may reduce EM emissions originating from both inside and outside of the component housing. Thus, the metal foam may prevent EMI from being generated by the component and may also protect the component from EMI originating from other components.

In one or more embodiments, the metal foam may be integrated onto the ECU housing using any number of different types of mechanical application interfaces (API). These mechanical APIs may provide an interface between the surface of an electronic module and/or electronic component itself and the metal foam. This interface may be used to provide highly efficient heat transfer, reliable mechanical binding between the ECU and the metal foam, protection for the ECU from damage, and impact energy absorption during drop or impact events. For example, the mechanical API may be provided instead of using a direct connection between the metal foam and the component (however, in some embodiments described herein, the interface may include a direct connection as well).

Any number of different types of mechanical APIs may be employed. As a first example, a "bubbly" thermal glue mechanical API may be used (this is illustrated further in FIG. 3). As a second example, a metal hooks and fastener mechanical API may be used (this is illustrated further in FIG. 4). As a third example, a "molded" metal foam provided over a plastic housing may be used (this is illustrated further in FIG. 5). As a fourth example, an integrated metal foam on a metal housing may be used (this is illustrated further in FIG. 6). These examples are not intended to be limiting and any other types of mechanical APIs may be employed as well.

In one or more embodiments, the first example mechanical API may include a thermal glue (the terms "glue," "paste," and the like may be used interchangeably) mechanical API. Through any manufacturing process, a mechanical API including thermal bonding glue may be surfaced on the ECU, and the metal foam may be placed on the thermal bonding glue. The thermal glue may comprise a material that provides heat dissipation and may provide a more effective connection between the ECU and the metal foam. This may be because the thermal glue may fill in any irregularities in the surface of the ECU and/or the surface of the metal foam that would otherwise not be in contact without the existence of the thermal glue interface. Alternatively, the thermal bonding glue may be placed on the metal foam and/or both the metal foam and the ECU. The ECU and the metal foam may then be pressed together until the ECU and metal foam are sufficiently bonded by the thermal bonding glue. This may be defined empirically or based on specifications of the material, glue thickness, and conditions. It should be noted that reference may be made to the metal foam being associated with an "ECU" herein. However, this is not intended to be limiting and may also be applicable to any other component as well.

In one or more embodiments, the integrated foam housing may bind the ECU housing and the metal foam together during the vehicle movement and may ensure high thermal conductivity between the heat source and the metal foam. The heat may be transferred in the same media because of bonding glue. Therefore, the heat transfer is effective with a minimal temperature increase. The thermal glue may firmly bind the heat source and the metal foam together because the thermal glue has a strong connecting force (for example, 25 kg or any other connecting force). When the parts with the metal foam cooling are assembled and disassembled during vehicle assembly or repair, the thermal contact or connection between the heat source and the metal foam may be impacted because there is no mechanical or physical displacement between the heat source and the metal foam. The thermal glue also may also perform a sealing function to prevent dust, moisture, and other material from entering the space between the heat source and the metal foam which could impact the thermal conductivity. The thermal glue may be brushed and sprayed to the surface of different materials including the metal foam, metal and/or plastic housing, etc. The thermal glue may be easily adapted to different shapes and dimensions of the surface. The thermal glue application location and area can be controlled in ECU assembly by design. The thermal glue may not impact the power inputs in ECU connectors and vehicle wire harnesses. The thickness of the thermal glue in application can be designed and controlled in the ECU assembly process. Thermal glue is self-adaptive to different geometrical shapes by designing the appropriate assembly process. The use of thermal glue may also expand the interface between the ECU surface and the metal foam by creating new geometrical shapes that fit within the space between the metal foam and the ECU surface.

In one or more embodiments, the second example mechanical API may include a metal hook and fastener mechanical API.

Some types of hook and fastener (for example, similar to a Velcro material) designs offer adhesive strength of up to 35 tones/$m^2$ (or any other strength), when tensile force is applied parallel to the fastener surface. When applied perpendicularly to the fastener surface, hook and fasteners can still withstand a force of seven tones/$m^2$ (or any other force), and may be opened and closed without using any additional tools. Applying a metal hook and fastener system to the ECU surface may be achieved by various methods, such as swing or stabling. Other methods may use surface-based tape with an easy peel-and-stick technique that allows the metal foam to instantly bond to the electronic surface. This may offer a simple method for cutting the tape to the required size and geometry, peel the liner away, and apply the tape to the clean dry ECU surface.

In one or more embodiments, the third example mechanical API may include a "molded" metal foam provided over a plastic housing.

Some of the electronic housings are made of plastic and adding metal foam to them may require a unique API, which may include an overmolding API. The overmolding API may form the plastic housing on a metal interface creating a strong bond between the API and the overmolded plastic housing and eliminating the need for assembly. The metal foam is embedded in the plastic housing and the metal foam is designed to directly contact the heat source inside the housing. This may provide heat transfer from the inside of the housing to the outside of the housing. The overmolding API may be optimized and improved based on the size, geometry, and required bonded strength. The overmolding API may also account for impacts of heat and material separation by geometrical design of the API. For example, the API may be provided as a "saw tooth" shape, a "T" shape, or any other geometrical feature to meet design requirements without adding materials or processes. One tooling can fit multiple designs by adding only inserts for modifications. For example, reducing a large cavity by having a smaller insert makes available space smaller and meets the required shape or geometry.

In one or more embodiments, the fourth example mechanical API may include an integrated metal foam on a metal housing. In this example mechanical API, the metal foam may be chemically bonded to any surface of the metal housing. To accomplish this, the metal housing may include there will have male and female edge configurations for side joints. The edge of the interior design of the metal foam may have a standing tongue that fits into the groove joints in the metal. Then metal foam may be pushed in grooves and compressed to bend the tongues over edges. The ECU housing material may be aluminum and the metal foam also aluminum (however, the ECU housing and metal foam may also comprise any other material), which may provide effective functionality because: (a) heat transfer from the housing to metal foam may be performed within the same material for the maximum thermal conductivity, and (b) heat dissipation may be performed from the housing through metal foam to air in active air mode or passive air mode.

The systems and methods described herein may provide a number of advantages. In terms of the metal foam itself, the systems and methods introduce new methods to absorb electrical magnetic compatibility (EMC) and electromagnetic interference (EMI) energy of an ECU, utilizing metal foam as an integrated part of the ECU to dissipate heat and provide EMI shielding. This invention eliminates the need for a "metal can" as an EMI shield, which provides for more space for additional onboard electronics. This allows for EMC/EMI OEM specifications to be more easily satisfied because the metal foam may be added for thermal management and simultaneously benefits EMI shielding. Thus, the systems and methods eliminate the need for individual thermal management and EMI shielding elements. This method can be applied to general vehicle electronics, not limited to one type of ECUs.

The very high porosity of the foam may provide for weight reduction. For example, a 90% porous block of foam weighs only 10% of the same bock made from solid aluminum. Given the highly-compact surface area of the foam, using metal foam will save space that is much needed for computer clusters and sensors. The surface area density of the foam may be up to 10,000 m2/m3 (for example), which is approximately 10 times higher compared to a vehicle radiator. Because of salient properties, metal foam cooling systems are highly efficient in removing heat at a reasonable pressure drop. Metal foam heat exchangers can reduce the thermal resistance to nearly half compared to commercial heat exchangers.

Turning to the figures, FIG. 1 illustrates an example of an electronic module 100 including a metal foam shield 104, in accordance with one or more embodiments of the disclosure. For example, ECUs 717 and/or any other type of electronic module and/or electronic component that may be included within a vehicle that may generate heat. The electronic module 100 may include a housing 103, which may encompass various types of circuity and/or processing units, such as integrated circuits (ICs), for example (not shown in the figure). The housing may comprise any material, such as a plastic that is rated to handle a threshold level of heat, a metallic material, and/or a composite material, for example. Any of the circuity and/or processing units included within the housing 103 may generate heat during operation.

In one or more embodiments, the electronic module 100 as described herein may also include metal foam 102 that may be used to serve the dual purposes of providing EMI shielding (for the circuitry and/or processing units included within the electronic component 100 as well as other electronic modules and/or components within the vehicle) and also providing heat dissipation for any heat generated by the circuitry and/or processing units. The metal foam 102 may be integrated with the electronic module 100 using any of the example interfaces described herein. Additionally, it should be noted that while the figure may only illustrate metal foam 102 applied to one surface of the electronic component 100, metal foam 102 may also be applied to any other number of surfaces as well and/or the metal foam 102 may encompass the entire surface of the electronic module 100.

Figure 2:
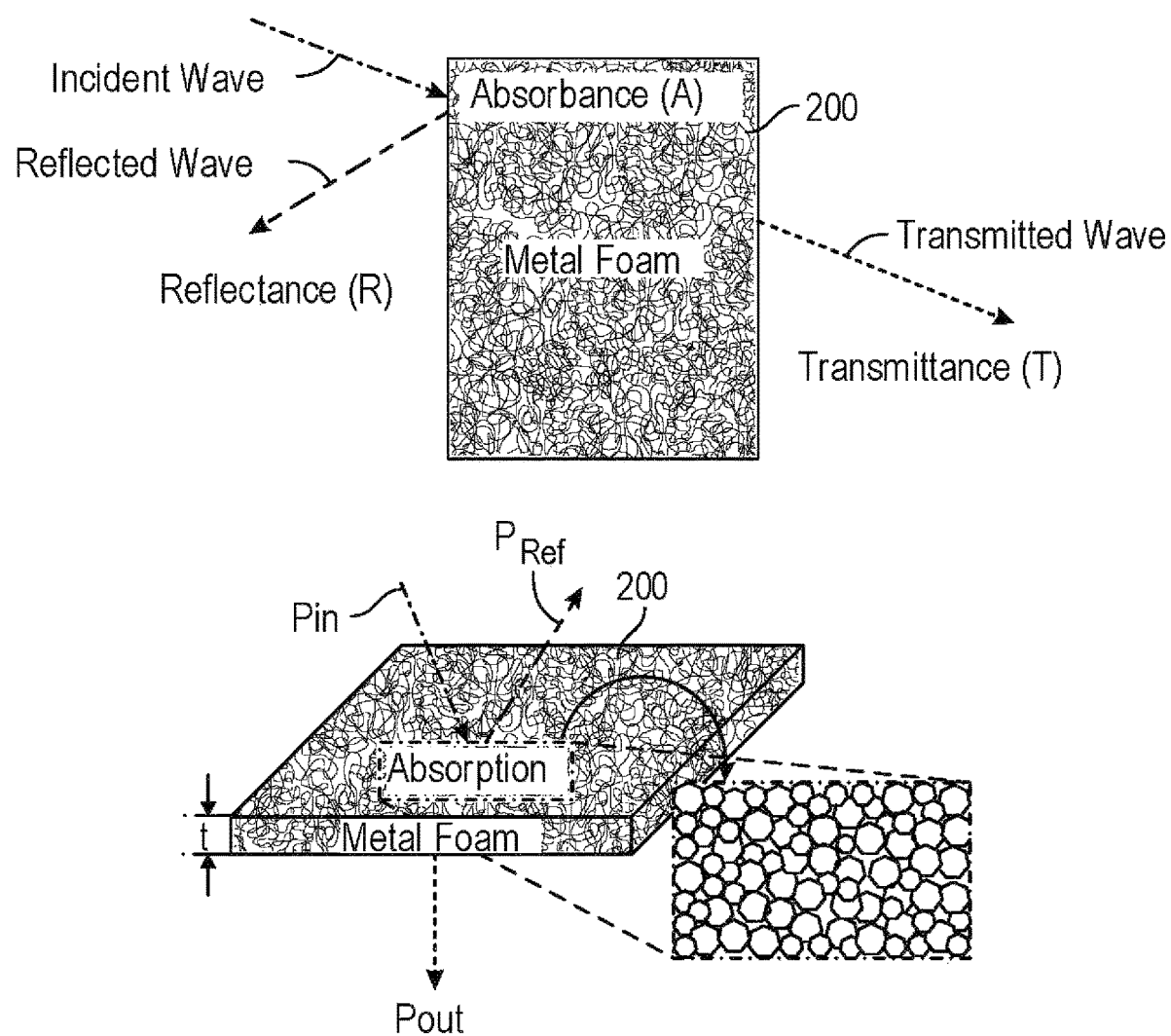
FIG. 2 illustrates an example metal foam, in accordance with one or more embodiments of the disclosure.

FIG. 2 illustrates example metal foam 200, in accordance with one or more embodiments of the disclosure.

In one or more embodiments, the shielding effectiveness (SE) of the metal foam 200 may be defined as:

$$SE = 10 \log 10(Pin/Pout) \quad \text{(Equation 1)}$$

where Pin may represent the incoming power of the EM wave, Pout may represent the outgoing power of the EM wave when it passes through the metal foam 200. The three main constituents may include reflection (SER), absorption (SEA), and multiple reflection (SEM). The SER and SEA may be the dominant mechanisms of open cell metal foam 200. The total shielding effectiveness (SET) may be defined as:

$$SET = SEA + SER \quad \text{(Equation 2)}$$

$$\text{where } SER = 108 + \log 10(\sigma/f\mu) \quad \text{(Equation 3)}$$

where $\mu$ may represent the magnetic permeability, $\sigma$ may represent the electrical conductivity of the shield materials and f may represent the frequency of electromagnetic wave, and SEA may be represented as:

$$SEA = -8.68(t/\delta) \quad \text{(Equation 4)}$$

where $\delta$ may represent skin depth of a material which can be defined as the distance up to which EM wave attenuated by 1/e or 37% and t may represent the thickness of the shield material. $\Delta$ may be defined as:

$$\delta = \text{sqrt}(2/\omega\mu\sigma) \quad \text{(Equation 5)}$$

where $\acute{O}$ may represent electrical conductivity, $\omega$ may represent angular frequency, and where $\sigma$ may be defined as:

$$\sigma = (1 - \theta/\theta\_M)^S)^t \quad \text{(Equation 6)}$$

where $\theta$ may represent the porosity, $\theta\_M$ may represent the porosity threshold (the maximum porosity of the foam, usually fixed to one) and s and t may be two fitting parameters defined below.

$$S = (5-n)/4 \quad \text{(Equation 7)}$$

$$T = 1 + 0.2536(n-1)^{1.09} \quad \text{(Equation 8)}$$

where n may include a value of 1, 2 or 3, depending on the powder compacting conditions: uniaxial, biaxial or triaxial, respectively.

The magnetic permeability of porous metal foam and electroplated metal is mainly tested by VSM (vibrating sample magnetometer)

$$\mu = B/H \quad \text{(Equation 9)}$$

where B is the magnetic flux density which is a measure of the actual magnetic field within a material and is considered as a concentration of magnetic field lines or magnetic flux per unit cross-sectional area. H is the magnetic field strength which is a measure of the magnetizing field produced by electric current flow in a wire or coil.

Based on this described mathematical model, major parameters of the metal foam 200 may be defined for each ECU or any other component, such as thickness (t), porosity ($\theta$), and electrical conductivity ($\mu$). Then, the system may be optimized accordingly for optimal heat transfer and EM shielding.

Figure 3:
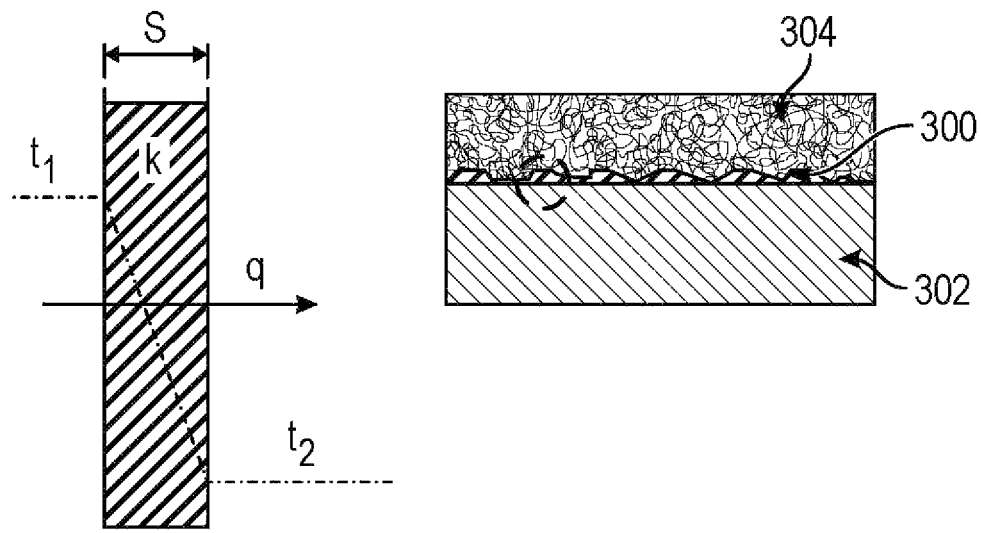
FIG. 3 illustrates an example interface, in accordance with one or more embodiments of the disclosure.
Figure 3:
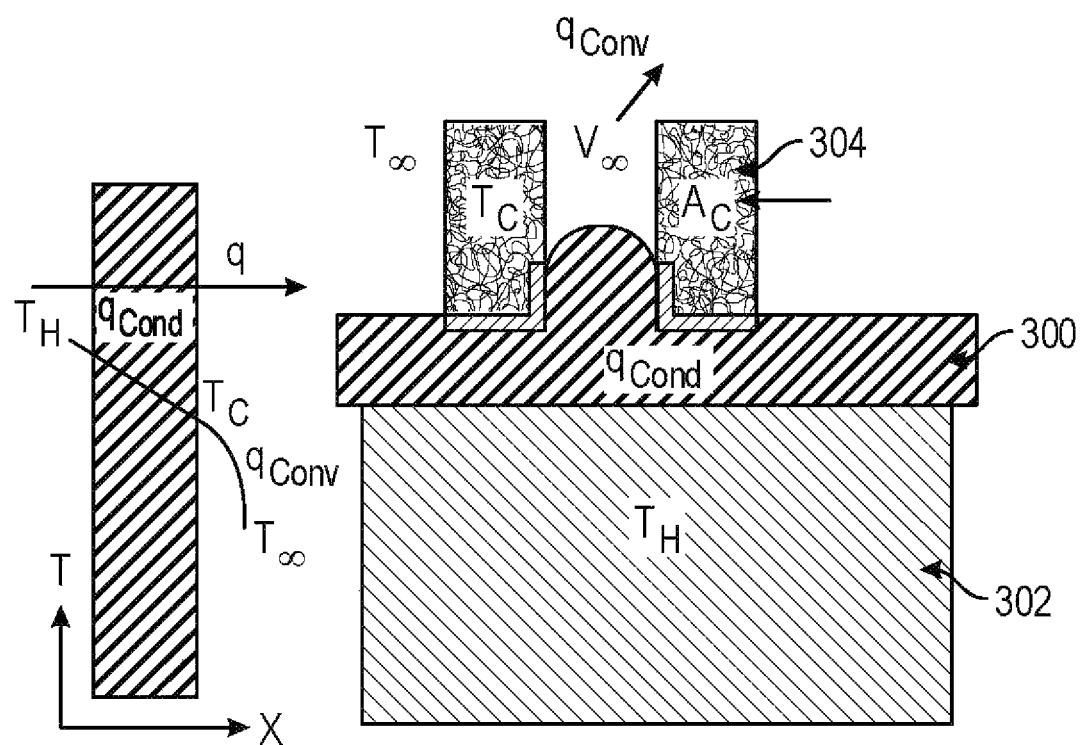

FIG. 3 illustrates an example interface 300, in accordance with one or more embodiments of the disclosure.

In one or more embodiments, through any manufacturing process, the interface 300 including thermal bonding glue may be surfaced on the ECU, and the metal foam 304 may be placed on the thermal bonding glue. Alternatively, the thermal bonding glue may be placed on the metal foam 304 and/or both the metal foam 304 and the ECU. The ECU and the metal foam 304 may then be pressed together until the ECU and metal foam 304 are sufficiently bonded by the thermal bonding glue.

The conductive heat transfer associated with the thermal glue API may be expressed with Fourier's Law, where the surface area (A) is a multiple factor, and increasing the surface may result in an increase in the heat transfer (q) (for example, based on Equation 1 presented below).

$$q = (k/s)AdT = UAdT \quad \text{(Equation 10)}$$

where, q may represent heat transfer (W, J/s), k may represent thermal conductivity of material (W/m K or W/m oC), s may represent material thickness (m), A may represent heat transfer area (m2), and dT may represent t1−t2, which may be a temperature gradient, difference—over the material (oC).

Pores in metal foam cause aerodynamic flow, which increases the convection heat transfer, thus increases the efficiency of cooling. Also, the heat transfer per unit surface through convection can be described as in the known relation, Newton's Law of Cooling, presented below as Equation 11.

$$q=hcAdT \qquad \text{(Equation 11)}$$

where q may represent heat transferred per unit time (W), A may represent heat transfer area of the surface (m2), hc may represent convective heat transfer coefficient of the process (W/(m2 oC)), hc may represent 10.45−v+10 v1/2, v=relative speed between object surface and air (m/s), dT may represent temperature difference between the surface and the bulk fluid (oC).

Figure 4:
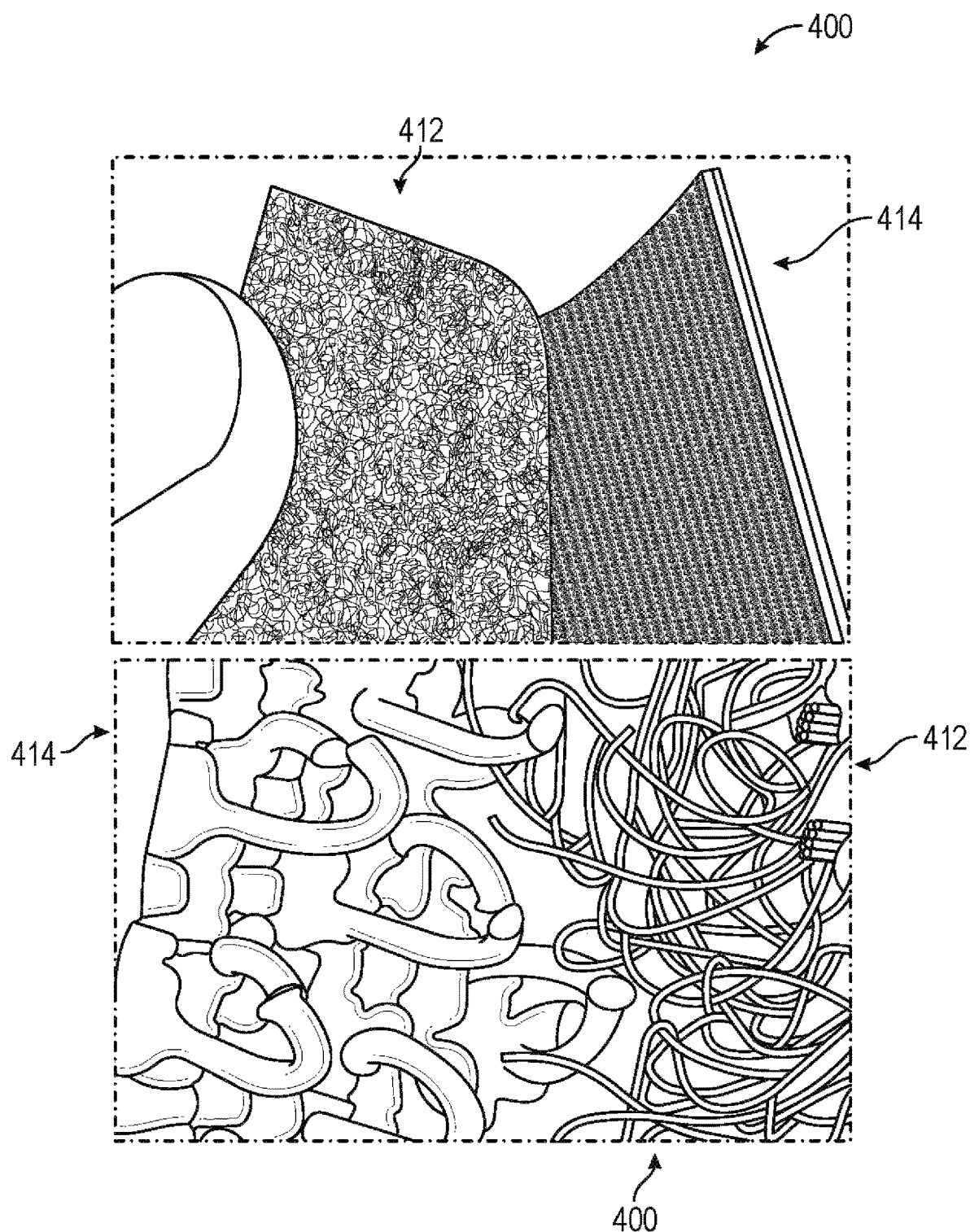
FIG. 4 illustrates an example interface, in accordance with one or more embodiments of this disclosure.

FIG. 4 illustrates an example interface 400, in accordance with one or more embodiments of the disclosure.

In one or more embodiments, the interface 400 may include a metal hook and fastener interface. The interface 400 may include a first portion 412 and a second portion 414. The first portion 412 may comprise the "fastener" portion of the interface 400. The second portion 414 may comprise the "hook" portion of the interface 400. The fastener elements included on the first portion 412 may removably engage with the hook elements included on the second portion 414 to create a single connected interface. One of the first portion 412 or the second portion 414 may be removably affixed to the metal foam and one or more of the first portion 412 or the second portion 414 may be removably affixed to the ECU. In this manner, the ECU and the metal foam may be configured to removably affix to one another through the engagement of the first portion 412 and the second portion 414.

Figure 5:
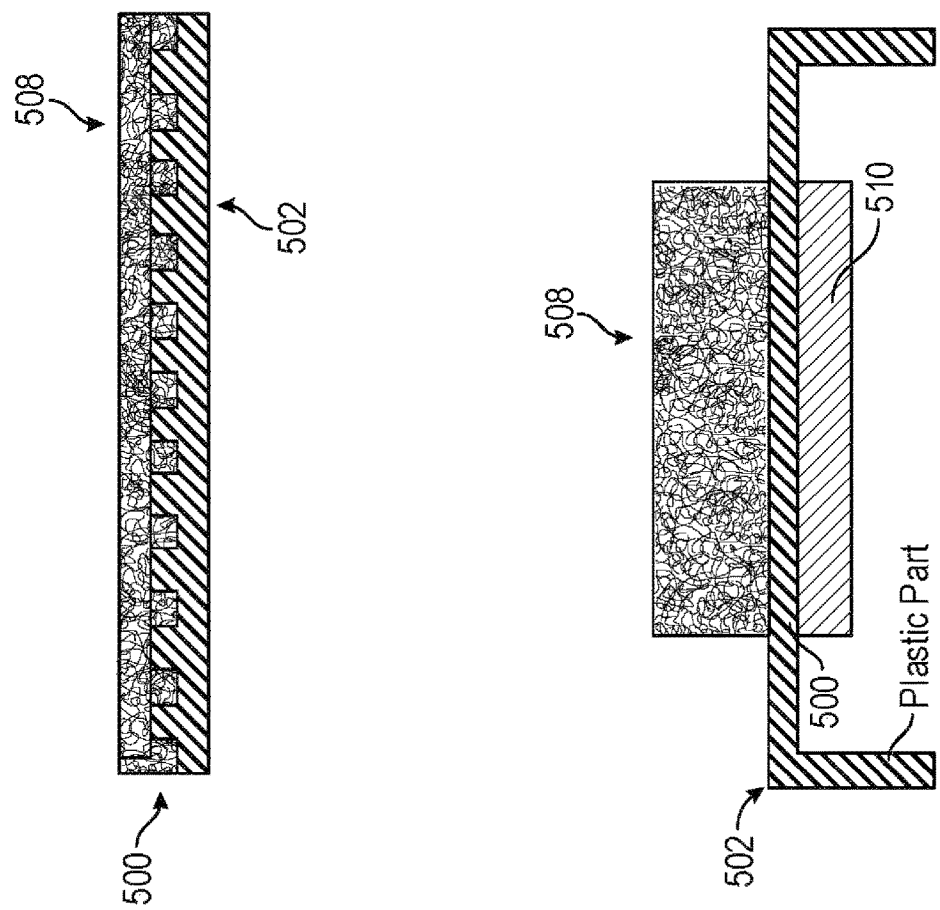
FIG. 5 illustrates an example interface, in accordance with one or more embodiments of this disclosure.

FIG. 5 illustrates an example interface 500, in accordance with one or more embodiments of this disclosure.

In one or more embodiments, the interface 500 may illustrate the third example of a mechanical API, which may include a molded metal foam 508 embedded within a plastic housing 502. As illustrated in the figure, the metal foam 508 may be extended within the housing 502 of the electronic module and may be in direct contract with an electronic component 510 (for example, an integrated circuit of an ECU and/or any other type of processing element and/or any other type of component). That is, the interface 500 may exist as a metal foam-plastic hybrid housing including a composite of plastic housing 502 and metal foam 508.

In one or more embodiments, the metal foam 508 may be embedded in the plastic housing 502 and the metal foam 508 may be designed to directly contact the electronic component 510 inside the housing 502. This may provide heat transfer from the inside of the housing 502 to the outside of the housing 502. The interface 500 may be optimized and improved based on the size, geometry, and required bonded strength. The interface 500 may also account for heat impacts and material separation by geometrical design of the interface 500. For example, the interface 500 may be provided as a "saw tooth" shape, a "T" shape, or any other geometrical feature to meet design requirements without adding materials or processes. These geometrical shapes may be used to lock and restrain the foam with the housing. Other example configurations may include an end with a circular loop (at the inside), a V-shaped end, etc. The housing may also be rated for temperatures that may be involved in the heat transfer from the heat source, so it may not be problematic for the foam to be in direct contact with the housing in this manner.

Figure 6:
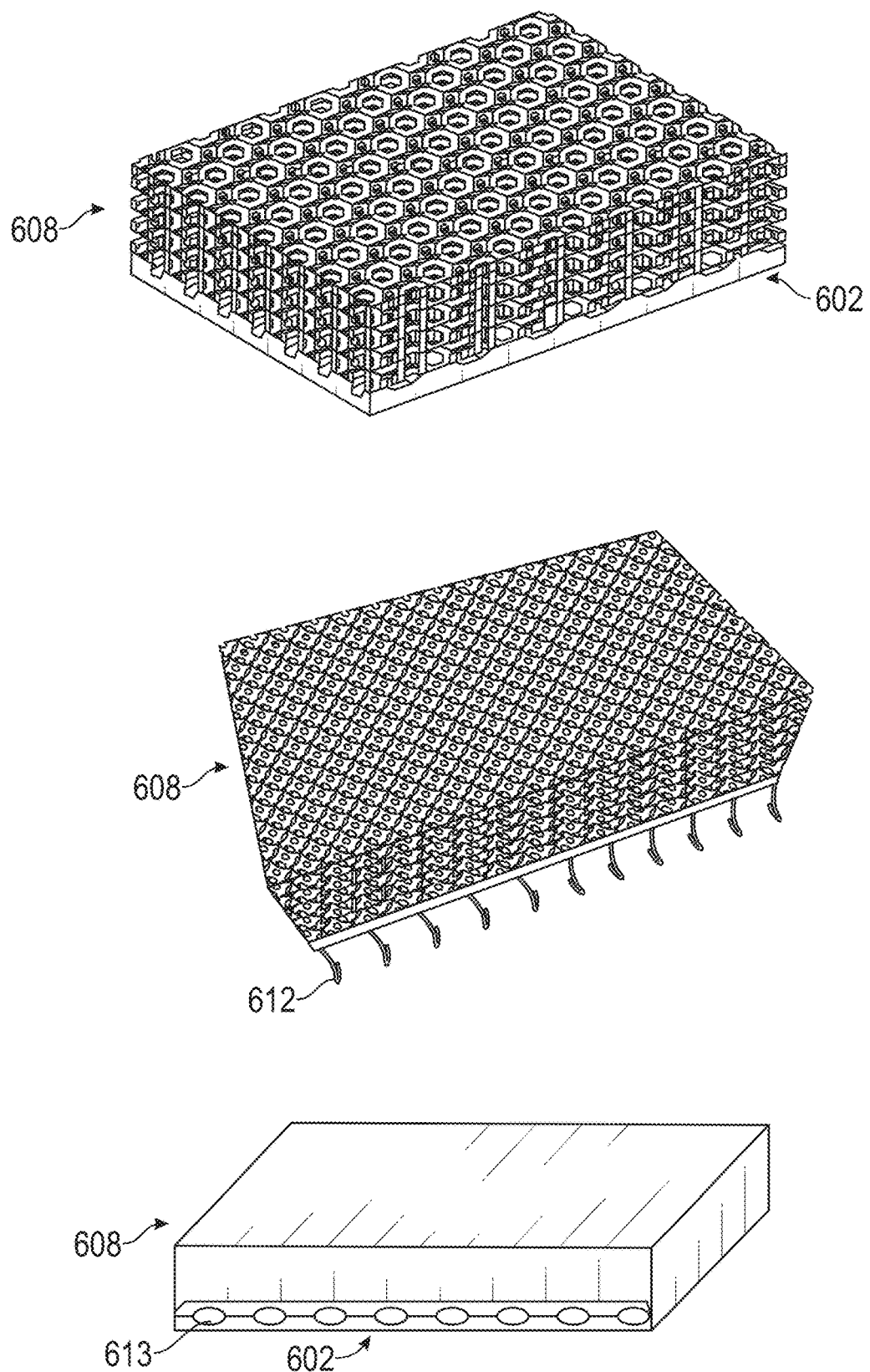
FIG. 6 illustrates an example interface, in accordance with one or more embodiments of this disclosure.

FIG. 6 illustrates an example interface 600, in accordance with one or more embodiments of this disclosure.

In one or more embodiments, the interface 600 may illustrate the fourth example of a mechanical API, which may include an integrated metal foam 608 on a metal housing 602. That is, similar to the third example interface 500 illustrated in FIG. 5, there may be direct contact between the metal foam 608 and the housing 602. However, rather than embedding the metal foam within a plastic housing to provide direct contact between the metal foam and the heat source as illustrated in FIG. 5, the housing included in the interface 600 may be metal. Given this, the metal foam 608 may not be required to be embedded within the housing, but may simply be in contact with the metal housing 602. In this configuration, heat may dissipate from the electronic component (not shown in the figure) to the metal housing 602, and then from the metal housing 602 to the metal foam 608.

In this example interface 600, the metal foam 608 may be chemically bonded to any surface of the metal housing 602. To accomplish this, the metal housing 602 may include male and female edge configurations for side joints. The edge of the interior design of the metal foam may have standing protrusion(s) 612 that fits into the groove joints 613 in the metal. Then, metal foam 608 may be pushed in grooves joints 613 and compressed to bend the protrusions 612 over edges. It should be noted that this interface 600 is merely an example of the fourth example mechanical API, and the direct contact between the metal foam 608 and the metal housing 602 may also be facilitated in any other manner. In other words, the protrusions 612 may allow for interlocking the foam 608 into the housing 602 by reshaping the inserted end. The distribution of these protrusions 612 and associated groove joints 613 may be defined by the geometry and mechanical loads to keep the foam 608 attached and secured.

Figure 7:
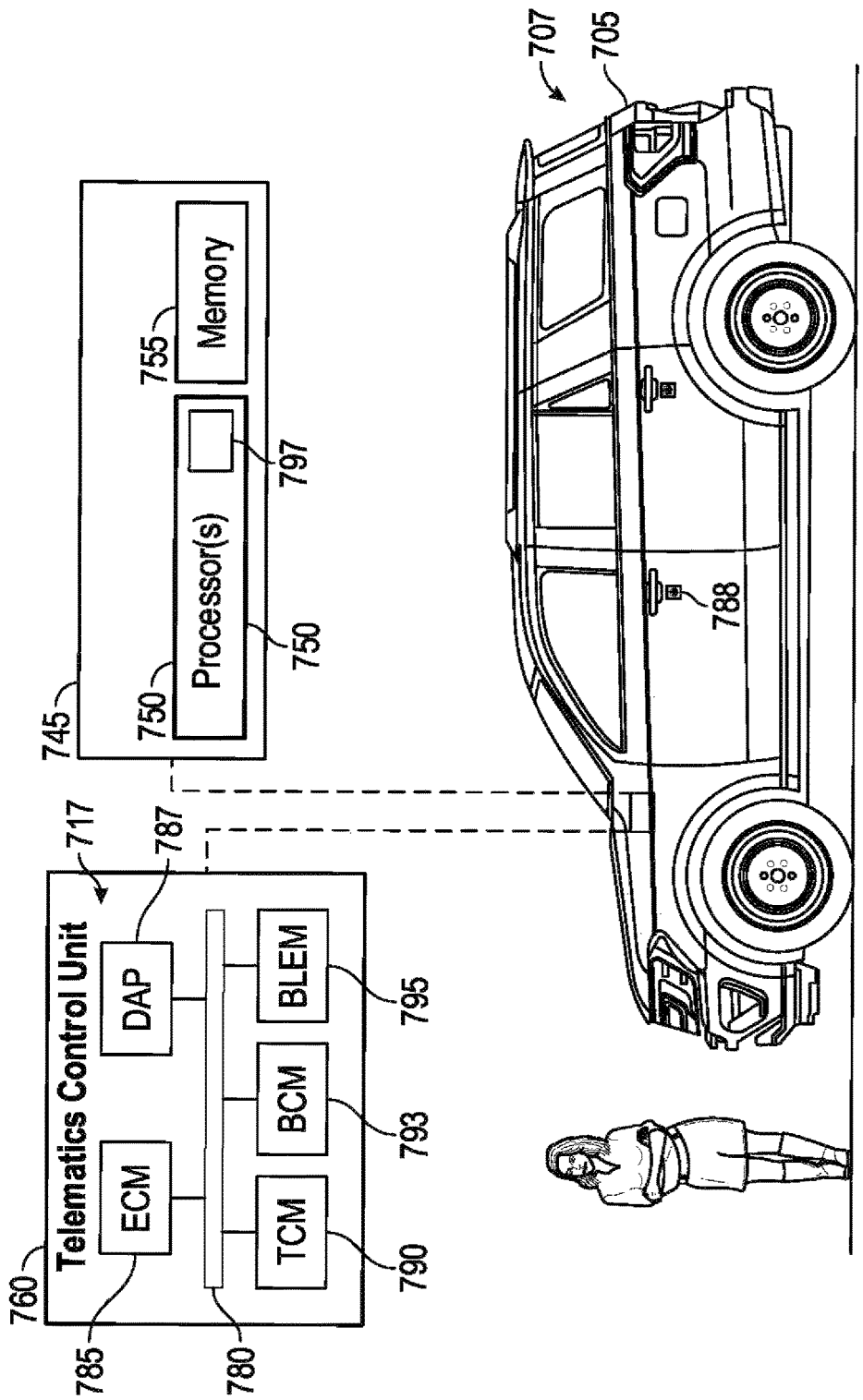
FIG. 7 illustrates an example vehicle system, in accordance with one or more embodiments of this disclosure.

FIG. 7 illustrates an example vehicle 700, in accordance with one or more embodiments of this disclosure. The vehicle 700 may include at least an automotive computer 745 and/or a Vehicle Controls Unit (VCU) 760. The vehicle 700 may also include any other types of electronic components, such as various types of sensors, for example.

In one or more embodiments, the automotive computer 745 may include one or more processor(s) 750 and memory 755. The VCU 760 may be disposed in communication with and/or be a part of the automotive computer 745. The VCU 760 may, in some example embodiments, be disposed in communication with one or more server(s) 770, which may be associated with and/or include a Telematics Service Delivery Network (SDN). The vehicle 705 may also receive and/or be in communication with a Global Positioning System (GPS) 775.

Although illustrated as a sport utility, the vehicle 705 may take the form of another passenger or commercial automobile such as, for example, a car, a truck, a sport utility, a crossover vehicle, a van, a minivan, a taxi, a bus, etc., and may be configured to include various types of automotive drive systems. Exemplary drive systems can include various types of internal combustion engine (ICE) powertrains having a gasoline, diesel, or natural gas-powered combustion engine with conventional drive components such as, a transmission, a drive shaft, a differential, etc. In another configuration, the vehicle 705 may be configured as an electric vehicle (EV). More particularly, the vehicle 705 may include a battery EV (BEV) drive system, or be configured as a hybrid EV (HEV) having an independent onboard power plant, a plug-in HEV (PHEV) that includes a HEV powertrain connectable to an external power source, and including a parallel or series hybrid powertrain having a combustion engine power plant and one or more EV drive systems. HEVs can include battery and/or super capacitor banks for power storage, flywheel power storage systems, or other power generation and storage infrastructure. The vehicle 705 may be further configured as a fuel cell vehicle (FCV) that converts liquid or solid fuel to usable power using a fuel cell, (e.g., a hydrogen fuel cell vehicle (HFCV) powertrain, etc.) and/or any combination of these drive systems and components.

Further, the vehicle 705 may be a manually driven vehicle, and/or be configured to operate in a fully autonomous (e.g., driverless) mode (e.g., level-5 autonomy) or in one or more partial autonomy modes. Examples of partial autonomy modes are widely understood in the art as autonomy Levels 1 through 5. An autonomous vehicle (AV) having Level-1 autonomy may generally include a single automated driver assistance feature, such as steering or acceleration assistance. Adaptive cruise control is one such example of a Level-1 autonomous system that includes aspects of both acceleration and steering. Level-2 autonomy in vehicles may provide partial automation of steering and acceleration functionality, where the automated system(s) are supervised by a human driver that performs non-automated operations such as braking and other controls. Level-3 autonomy in a vehicle can generally provide conditional automation and control of driving features. For example, Level-3 vehicle autonomy typically includes "environmental detection" capabilities, where the vehicle can make informed decisions independently from a present driver, such as accelerating past a slow-moving vehicle, while the present driver remains ready to retake control of the vehicle if the system is unable to execute the task. Level-4 autonomy includes vehicles having high levels of autonomy that can operate independently from a human driver, but still include human controls for override operation. Level-4 automation may also enable a self-driving mode to intervene responsive to a predefined conditional trigger, such as a road hazard or a system event. Level-5 autonomy is associated with autonomous vehicle systems that require no human input for operation, and generally do not include human operational driving controls.

In one or more embodiments, The VCU 760 can be configured to provide vehicle connectivity to wireless computing systems onboard and offboard the vehicle 705, and may include a Navigation (NAV) receiver 788 for receiving and processing a GPS signal from the GPS 775, a Bluetooth® Low-Energy (BLE) Module (BLEM) 795, a Wi-Fi transceiver, an Ultra-Wide Band (UWB) transceiver, and/or other wireless transceivers (not shown in FIG. 7) that may be configurable for wireless communication between the vehicle 705 and other systems, computers, and modules. The TCU may be disposed in communication with the ECUs 717 by way of a bus 780. In some aspects, the TCU may retrieve data and send data as a node in a CAN bus. The one or more network(s) 725 illustrate an example of one possible communication infrastructure in which the connected devices may communicate. The one or more network(s) 725 may be and/or include the Internet, a private network, public network or other configuration that operates using any one or more known communication protocols such as, for example, transmission control protocol/Internet protocol (TCP/IP), Bluetooth®, Wi-Fi, and cellular technologies such as Time Division Multiple Access (TDMA), Code Division Multiple Access (CDMA), High Speed Packet Access (HSPDA), Long-Term Evolution (LTE), Global System for Mobile Communications (GSM), and Fifth Generation (5G), to name a few examples.

The VCU 760 may provide a software and hardware infrastructure for performing aspects of the present disclosure. For example, the VCU 760 can provide communication and control access for two or more Electronic Control Units (ECUs) 717 using a Controller Area Network (CAN) bus 780.

The CAN bus 780 may be configured as a multi-master serial bus standard for connecting two ECUs as nodes using a message-based protocol that can be configured and/or programmed to allow the ECUs 717 to communicate with each other in applications. The CAN bus 780 may be or include a high-speed CAN (which may have bit speeds up to 1 Mb/s on CAN, 5 Mb/s on CAN Flexible Data Rate (CAN FD)), and can include a low speed or fault tolerant CAN (up to 125 Kbps), which may use a linear bus configuration. In some aspects, the ECUs may communicate with a host computer (e.g., the automotive computer 745 and/or the server(s) 770, etc.), and may also communicate with one another without the necessity of a host computer. The CAN bus 780 may connect the ECUs 717 with the automotive computer 745 such that the automotive computer 745 may retrieve information from, send information to, and otherwise interact with the ECUs 717 to perform steps described according to embodiments of the present disclosure. The CAN bus 780 may connect CAN bus nodes (e.g., the ECUs 717) to each other through a two-wire bus, which may be a twisted pair having a nominal characteristic impedance.

The ECUs 717, when configured as nodes in the CAN bus 780, may each include a central processing unit, a CAN controller, and a transceiver (not shown in FIG. 7). In an example embodiment, the ECUs 717 associated with the VCU 760 can include an Engine Control Module (ECM) 785, a DAP controller 787, a Transmission Control Module (TCM) 790, a Body Control Module (BCM) 793, and/or the BLEM 795. In some aspects, the VCU 760 may control aspects of the vehicle 705 through the control modules 785, 787, 790, 793, 795, etc., and implement one or more instruction sets received from the application(s) 735 operating on the mobile device 720.

The BCM 793 is a processor-based power distribution center that can supervise and control functions related to the car body such as lights, windows, security, door locks and access control, and various comfort controls. The BCM 793 may also operate as a gateway for bus and network interfaces to interact with remote electronic control units (ECUs) for other systems. The ECUs 717 may control various loads directly via the CAN bus 780 communication or BCM 793.

The BCM 793 generally includes integration of sensors, vehicle performance indicators, and variable reactors associated with vehicle systems. The BCM 793 may coordinate a wide range of vehicle functionality and systems, including energy management systems, alarms, vehicle immobilizers, driver and rider access authorization systems, Phone-as-a-Key (PaaK) systems, driver assistance systems, AV control systems, power feature systems (e.g., windows, doors, actuators, etc.) and other functionality. The BCM 793 may be configured for vehicle energy management, exterior lighting control, wiper functionality, heating ventilation and air conditioning systems, and driver integration systems. In other aspects, the BCM 793 may control auxiliary equipment functionality, and/or be responsible for integration of such functionality with vehicle sub-systems (not shown in FIG. 7).

According to embodiments of the present disclosure, the BCM 793 may be operatively connected with the interface controller 787. The interface controller 787 may include a processor (not shown in FIG. 1) a computer-readable memory (not shown in FIG. 7), and a door access panel input/output device (described hereafter as the "interface device 788"). According to embodiments of the present disclosure, the interface device 788 may include a display that can receive user touch input, such as a touch screen or other mechanism. In other aspects, the interface device 788 may provide display output generated by the interface controller 787, including a list of user identifiers, a menu, an alpha-numeric keypad, a menu of selectable icons, a menu of selectable photographs, etc. The interface controller 787 may also be disposed in communication with the automotive computer 745, and may transmit information to an authentication manager 797 configured to coordinate command instructions to the VCU 760 for providing vehicle access, navigational access, AV systems control, etc.

The ECUs 717 are described for exemplary purposes only, and are not intended to be limiting or exclusive. Control and/or communication with other control modules not shown in FIG. 7 is possible, and such control is contemplated. For example, although discussed as a functionality of the automotive computer 745, it should be appreciated that the authentication manager 797 may be a part or functionality controlled with the BCM or the other ECUs 717 described herein.

The automotive computer 745 may include one or more processor(s) 750 and a computer-readable memory 755. The automotive computer 745 may be installed in an engine compartment of the vehicle 705 (or elsewhere in the vehicle 705). The automotive computer 745 may include, in one example, the one or more processor(s) 750, and a computer-readable memory 755. In other example embodiments, the VCU 760 may be integrated with and/or be incorporated with the automotive computer 745. The computing system architecture of the automotive computer 745 may omit certain computing modules. It should be readily understood that the computing environment depicted in FIG. 7 is one example of a possible implementation according to the present disclosure, and thus, it should not be considered limiting or exclusive.

The one or more processor(s) 750 may be disposed in communication with one or more memory devices (e.g., the memory 755 and/or one or more external databases (not shown in FIG. 7). The one or more processor(s) 750 may utilize the memory 755 to store programs in code and/or to store data for providing AV access using the system 707 in accordance with the disclosure. The memory 755 may be a non-transitory computer-readable memory. The processor(s) 750 may be configured to execute computer-executable instructions stored in the memory 755 for performing various functions of the system 707 as well as for performing vehicle control capabilities in accordance with the disclosure. Consequently, the memory 755 may be used for storing code and/or data code and/or data for performing operations in accordance with the disclosure.

The memory 755 can include any one or a combination of volatile memory elements (e.g., dynamic random access memory (DRAM), synchronous dynamic random access memory (SDRAM), etc.) and can include any one or more nonvolatile memory elements (e.g., erasable programmable read-only memory (EPROM), flash memory, electronically erasable programmable read-only memory (EEPROM), programmable read-only memory (PROM), etc.

The memory 755 may be one example of a non-transitory computer-readable medium, and may be used to store programs in code and/or to store data for performing various operations in accordance with the disclosure. The instructions in the memory 755 can include one or more separate programs, each of which can include an ordered listing of computer-executable instructions for implementing logical functions. In another exemplary implementation, some or all components of the automotive computer 745 may be shared with the VCU 760.

The memory 755 may store various code modules such as, for example, a secure communication controller (not shown in FIG. 7) for establishing the one or more wireless channels 730 (which may, in some embodiments, be encrypted channel(s)) between the mobile device 720, the VCU 760, and/or the automotive computer 745. The memory 755 may also receive the one or more instruction sets for providing vehicle access to rideshare customers (e.g., the user 740). The instruction sets may include encryption keys, stored PINs, hash results, PIN indices, user profiles associated with one or more users (e.g., the user 740), etc.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, certain systems and methods. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

What is claimed is:

1. A vehicle comprising:
an electronic control unit (ECU) comprising an electronic component included within a housing; and
a metal foam configured to dissipate heat produced by the electronic component and also configured to facilitate electromagnetic interference (EMI) shielding for the electronic component; and
an interface between the ECU and the metal foam, wherein the interface provides a connection between the ECU and metal foam to facilitate heat dissipation from the electronic component to a location outside of the housing, wherein the housing comprises at least one of: a plastic material or a metal material, and wherein the metal foam is in direct contact with the electronic component.

2. The vehicle of claim 1, wherein the housing comprises a groove, wherein the metal foam comprises a protrusion extending from the metal foam, and wherein the direct contact is facilitated by an engagement between the protrusion and the groove.

3. The vehicle of claim 1, wherein the interface comprises a thermal compound.

4. The vehicle of claim 1, wherein the interface comprises a metal hook and fastener, wherein a first portion of the metal hook and fastener is affixed to the metal foam, and wherein a second portion of the metal hook and fastener is affixed to the housing.

5. The vehicle of claim 1, wherein the metal foam is a first metal foam configured to facilitate heat dissipation from a first surface of the electronic component, and wherein the vehicle comprises a second metal foam configured to facilitate heat dissipation from a second surface of the electronic component.

6. An apparatus comprising:
an electronic control unit (ECU) comprising an electronic component included within a housing; and
a metal foam configured to dissipate heat produced by the electronic component and also configured to facilitate electromagnetic interference (EMI) shielding for the electronic component; and
an interface between the ECU and the metal foam, wherein the interface provides a connection between the ECU and metal foam to facilitate heat dissipation from the electronic component to a location outside of the housing,
wherein the metal foam is a first metal foam configured to facilitate heat dissipation from a first surface of the electronic component, and wherein the apparatus comprises a second metal foam configured to facilitate heat dissipation from a second surface of the electronic component.

7. The apparatus of claim 6, wherein the housing comprises a plastic material, wherein the interface comprises a portion of the metal foam that is embedded within the housing, and wherein the metal foam is in direct contact with the electronic component.

8. The apparatus of claim 7, wherein the housing comprises a groove, wherein the metal foam comprises a protrusion extending from the metal foam, and wherein the direct contact is facilitated by an engagement between the protrusion and the groove.

9. The apparatus of claim 6, wherein the housing comprises a metal material, and wherein the interface comprises a portion of the metal foam that is in direct contact with the housing.

10. The apparatus of claim 6, wherein the interface comprises a thermal compound.

11. The apparatus of claim 6, wherein the interface comprises a metal hook and fastener, wherein a first portion of the metal hook and fastener is affixed to the metal foam, and wherein a second portion of the metal hook and fastener is affixed to the housing.

12. A system comprising:
an electronic control unit (ECU) comprising an electronic component included within a housing; and
a metal foam configured to dissipate heat produced by the electronic component and also configured to facilitate electromagnetic interference (EMI) shielding for the electronic component; and
an interface between the ECU and the metal foam, wherein the interface provides a connection between the ECU and metal foam to facilitate heat dissipation from the electronic component to a location outside of the housing,
wherein the interface comprises a metal hook and fastener, wherein a first portion of the metal hook and fastener is affixed to the metal foam, and wherein a second portion of the metal hook and fastener is affixed to the housing.

13. The system of claim 12, wherein the housing comprises a plastic material, wherein the interface comprises a portion of the metal foam that is embedded within the housing, and wherein the metal foam is in direct contact with the electronic component.

14. The system of claim 12, wherein the housing comprises a metal material, and wherein the interface comprises a portion of the metal foam that is in direct contact with the housing.

15. The system of claim 14, wherein the housing comprises a groove, wherein the metal foam comprises a protrusion extending from the metal foam, and wherein the direct contact is facilitated by an engagement between the protrusion and the groove.

16. The system of claim 12, wherein the interface comprises a thermal compound.

* * * * *